US005629565A

United States Patent [19]

Schlaak et al.

[11] Patent Number: 5,629,565

[45] Date of Patent: May 13, 1997

[54] MICROMECHANICAL ELECTROSTATIC RELAY WITH GEOMETRIC DISCONTINUITY

[75] Inventors: Helmut Schlaak; Hans-Juergen Gevattter; Lothar Kiesewetter; Joachim Schimkat, all of Berlin, Germany

[73] Assignee: Siemens Aktiengesellschaft, Munich, Germany

[21] Appl. No.: 538,440

[22] Filed: Oct. 3, 1995

[30] Foreign Application Priority Data

Oct. 18, 1994 [DE] Germany .......................... 44 37 261.2

[51] Int. Cl.$^{6}$ .......................... H01L 23/48; H01L 23/52; H01L 29/40

[52] U.S. Cl. .......................... 257/780; 257/781; 257/785; 257/786; 310/309; 310/328; 200/181; 200/522

[58] Field of Search .................................... 257/780, 781, 257/735, 736, 785, 786; 310/309, 328; 200/181, 522

[56] References Cited

U.S. PATENT DOCUMENTS

| | | | |
|---|---|---|---|
| 4,480,162 | 10/1984 | Greenwood | 200/181 |
| 4,654,555 | 3/1987 | Ohba et al. | 310/332 |
| 4,672,257 | 6/1987 | Oota et al. | 310/328 |
| 4,742,263 | 5/1988 | Harnden, Jr. et al. | 310/331 |
| 4,959,515 | 9/1990 | Zavracky et al. | 200/181 |
| 5,258,591 | 11/1993 | Buck | 200/181 |
| 5,367,136 | 11/1994 | Buck | 200/600 |
| 5,544,001 | 8/1996 | Ichiya et al. | 361/233 |

FOREIGN PATENT DOCUMENTS

| | | | |
|---|---|---|---|
| 2800343 | 7/1978 | Germany | 200/181 |
| 4205029C1 | 11/1993 | Germany . | |
| 0601771 | 4/1978 | U.S.S.R. | 200/181 |

*Primary Examiner*—William Mintel
*Attorney, Agent, or Firm*—Hill, Steadman & Simpson

[57] ABSTRACT

A micromechanical electrostatic relay has, on the one hand, a base substrate with a base electrode and a base contact piece and, on the other hand, an armature substrate with an armature spring tongue that is etched free and curved away from the base substrate and that has an armature contact piece. When a control voltage is present between the two electrodes, the spring tongue unrolls on the base substrate until it is stretched and causes the two contact pieces to touch. In order to prevent a creeping contacting and make the closing and opening of the contact abrupt, a geometric discontinuity is provided in the wedge-shaped air gap between the two electrodes. This discontinuity is formed by a partially curved, partially straight design of the spring tongue, by an offset of the beginning of the electrode relative to the spring attachment, and/or by an air gap between the spring attachment and the base electrode. The result is an unambiguous switching hysteresis with trip events when closing and opening the contact.

10 Claims, 6 Drawing Sheets

MICROMECHANICAL ELECTROSTATIC RELAY WITH GEOMETRIC DISCONTINUITY

RELATED APPLICATIONS

The present application is related to copending applications Hill Case No. P95,2361, filed Oct. 3, 1995, Ser. No. 08/539,012, entitled "Micromechanical Relay", and Hill Case No. P95,2359, filed Oct. 3, 1995, Ser. No. 08/538,367, entitled "Micromechanical Relay".

BACKGROUND OF THE INVENTION

The invention is directed to a micromechanical electrostatic relay having a base substrate that carries a base electrode layer and at least one base contact piece. An armature substrate is provided that lies on the base substrate and has at least one armature spring tongue that is worked free and attached at one side, and which carries an armature electrode layer and an armature contact piece at its free end. The spring tongue is bent away from the base substrate by a steady curvature in a quiescent condition, so that a wedge-shaped air gap is formed between the two electrode layers. The ;spring tongue conforms to the base substrate and the two contact pieces lie against one another in the working condition when a voltage is present between the electrode layers.

DE 42 05 029 C1 already discloses such a micromechanical relay. As set forth therein, such a relay structure can be manufactured, for example, of a crystalline semiconductor substrate, preferably silicon, whereby the spring tongue serving as the armature is formed out of the semiconductor substrate by appropriate doping and etching processes. How a uniform curvature can be produced in the spring tongue with a multilayer structure is likewise already fundamentally disclosed therein, whereby the various layers are stressed relative to one another due to their different coefficients of expansion and deposition temperatures. The curved spring tongue with its correspondingly curved armature electrode thus forms a wedge-shaped air gap relative to a planar base electrode on a planar base substrate that, for example, can likewise be composed of silicon or of glass as well. By applying a control voltage between the armature electrode of the spring tongue and the planar base electrode, the curved spring tongue rolls on the base electrode and thus forms what is referred to as a migrating wedge. The spring tongue is stretched during this rolling until the free end with the armature contact piece touches the base contact piece on the base substrate.

What accompanies this described switching event with the migrating wedge, whereby the steadily curved armature electrode rolls steadily, is that the actual closing and opening of the contact also occurs in a continuous motion. As a result, what is referred to as a creeping contacting occurs. An arc or an undesired heating of the contact pieces arises in the transition phase wherein the contact pieces only touch with a slight contacting force and, consequently, with a high contact resistance, whereby the contact surfaces are damaged. An abrupt switching event is therefore generally desired for relays, whereby the spring tongue or the armature contact piece completely strikes the base electrode or base contact piece when the response voltage is reached, and thus a defined contacting force results upon initial contact of the working contact. The analogous case , applies to the holding event when the control voltage is lowered. The opening of the contacts and thus the drop-off of the spring tongue should likewise occur as a trip event when the control voltage is lowered it crosses the holding voltage.

SUMMARY OF THE INVENTION

An object of the invention is to improve a micromechanical relay of the type initially cited such that it has a switching characteristic with an unambiguous trip behavior, and, thus the afore-mentioned creeping switch behavior is avoided.

This object is achieved in that the wedge-shaped air gap between the electrodes comprises at least one geometric discontinuity. What is achieved as a result of this inventively provided interruption of the continuously wedge-shaped air gap between the two electrodes is that an abrupt switching event respectively closes or opens the contact.

In a preferred embodiment of the invention, the spring tongue comprises a steadily curved section beginning in the region of the attachment thereof to the armature substrate and, following thereupon, a straight section toward its free end, whereby the length of the curved section can preferably amount to approximately 20 to 40% of the overall length of the spring tongue. In this embodiment, thus the spring tongue initially rolls steadily on the base electrode via its curved section until the transition to the straight section is reached. At this moment, the remaining, straight section of the spring tongue strikes the end of the base electrode in an abrupt switching event, whereby the armature contact piece suddenly strikes the base contact piece.

It is provided in another advantageous development that the beginning of the electrode surface has an offset relative to the attachment of the spring tongue to the armature substrate the length of which can advantageously amount to 20 to 40% of the overall length of the spring tongue. In this embodiment, thus the spring tongue can be continuously curved over its entire length, whereas the discontinuity is now produced by the offset beginning of the electrode on the spring tongue.

Further, an abrupt switching behavior can be produced since the base electrode comprises a predetermined gap relative to the armature electrode at the attachment point of the spring tongue, the height of the gap amounting to at least 10% of the total excursion of the free spring end relative to the base substrate in the quiescent condition. This height of the gap, which can preferably amount to between 10 and 20% of the spring excursion, is thus significantly greater than the thickness of the insulating layer that is required in any case for the necessary insulation between the two electrodes at the clamping location.

Let it also be additionally mentioned that the techniques for producing a discontinuity can be applied both individually as well as in combination.

For producing the contacting force, a contact spring region that is partially cut free by slots and on which the armature contact piece is arranged is formed at the free end of the spring tongue in a known way. The spacing between the two contact pieces is thus less than the spacing between the two electrodes in the region of the free end. When the contact spring region is centrally cut free, the armature electrode can thus lie flat on the base electrode at two lateral tabs next to the contact spring region, whereas the contact spring region is bent through due to the elevated contact pieces and thus generates the contacting force.

The invention is set forth in greater detail below with reference to exemplary embodiments on the basis of the drawings.

DESCRIPTION OF THE PREFERRED EMBODIMENTS

Figure 1:
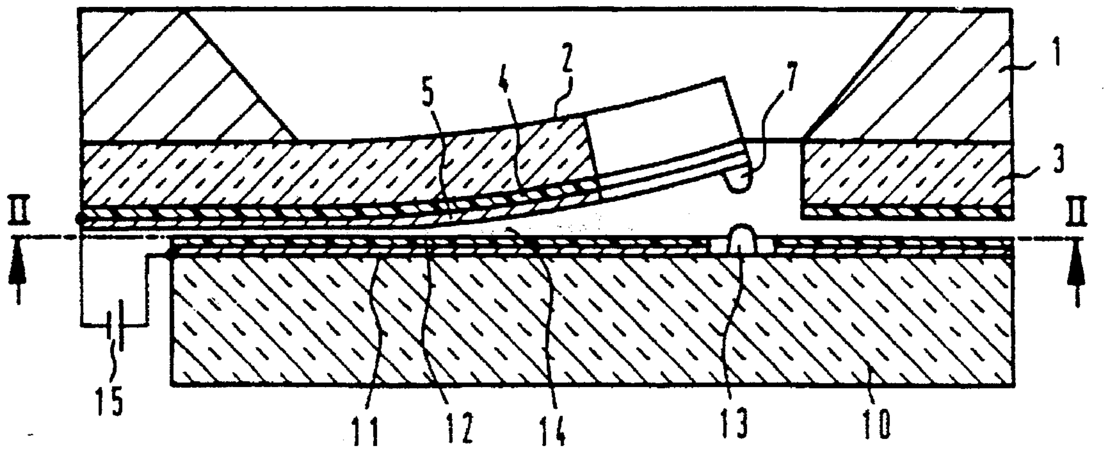
FIG. 1 is a schematic illustration of the basic structure of a micromechanical relay with a steadily curved armature spring tongue, shown in section.

FIG. 1 schematically shows the basic structure of a micromechanical electrostatic relay wherein the invention is applied. At an armature substrate, preferably a silicon wafer, an armature spring tongue 2 is worked free with selective etching processes within a corresponding doped silicon layer. A double layer 4 is produced at the underside of the spring tongue, this double layer 4 being composed in the example of a $SiO_2$ layer that produces compressive strains and of a $Si_3N_4$ layer that produces tensile stresses. The spring tongue can be given a desired curvature with an appropriate selection of the layer thicknesses. Finally, the spring tongue carries a metallic layer as an armature electrode 5 at its underside. This armature electrode 5, as may be seen from FIG. 2, is divided in two in order to form a metallic lead 6 for the armature contact piece 7 in the middle of the spring tongue.

Figure 2:
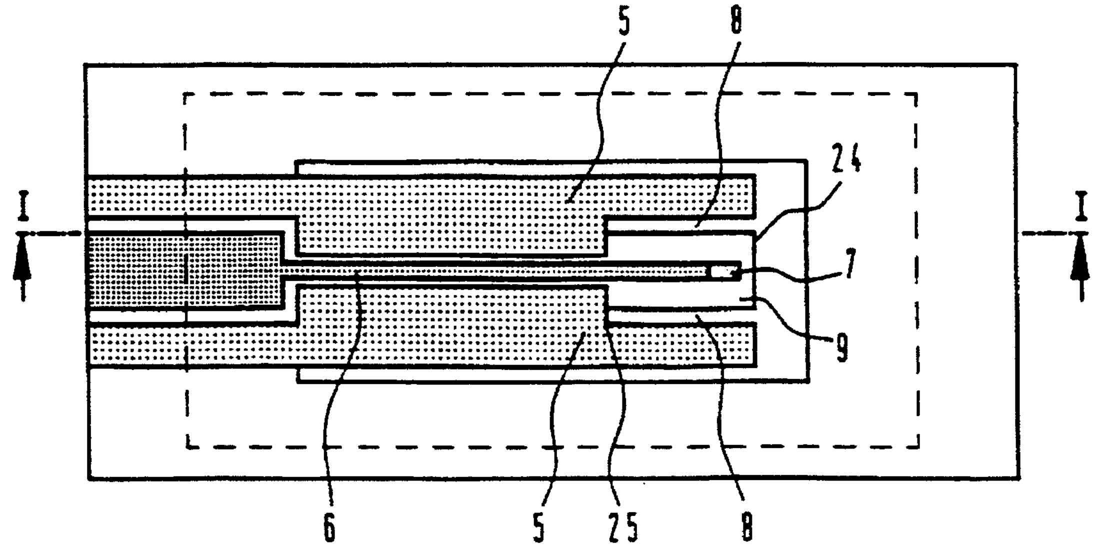
FIG. 2 is a view from below onto the armature substrate of FIG. 1.

As may be seen further from FIG. 2, a contact spring region or section 9 that carries the contact piece 7 is cut free by two slots 8 at the free, end of the spring tongue. When the armature electrode 5 lies flat against a base electrode, this contact spring section 9 can bend elastically, the contacting force being generated as a result thereof.

As may be seen further from FIG. 1, the armature substrate 1 is secured on a base substrate 10 that is composed of pyrex glass in the present example but that, for example, could also be composed of silicon. On its planar surface, the base substrate 10 carries a base electrode 11 and an insulating layer 12 in order to insulate the base electrode 11 from the armature electrode 5. In a way not shown in detail, a base contact piece 13 is provided with a lead and, of course, is arranged in insulated fashion from the base electrode 11. A wedge-shaped air gap 14 is formed between the curved sprint; tongue 2 with the armature electrode, on the one hand, and the base electrode, on the other hand. When a voltage from a voltage source 15 is present between the two electrodes 5 and 11, the spring tongue unrolls on the base electrode 11, as a result of which the armature contact piece 7 is connected to the base contact piece 13.

The size relationships and layer thicknesses in FIGS. 1 and 2 are shown only from the point of view of clarity and do not correspond to the actual conditions. A structure that had about the following dimensions was selected for the investigations (with the assistance of a computer simulation) set forth below:

| | |
|---|---|
| Length of the spring tongue (2) | 1300 µm |
| Width of the spring tongue | 1000 µm |
| Thickness of the spring tongue (Si layer) (2) | 10 µm |
| $SiO_2$ layer thickness (4) | 500 mn |
| $Si_3N_4$ layer thickness (4) | 50 nm |
| Length of the slots (8) | 500 µm |
| Excursion of tongue end relative to base electrode approximately | 11 µm |

Figure 3A:
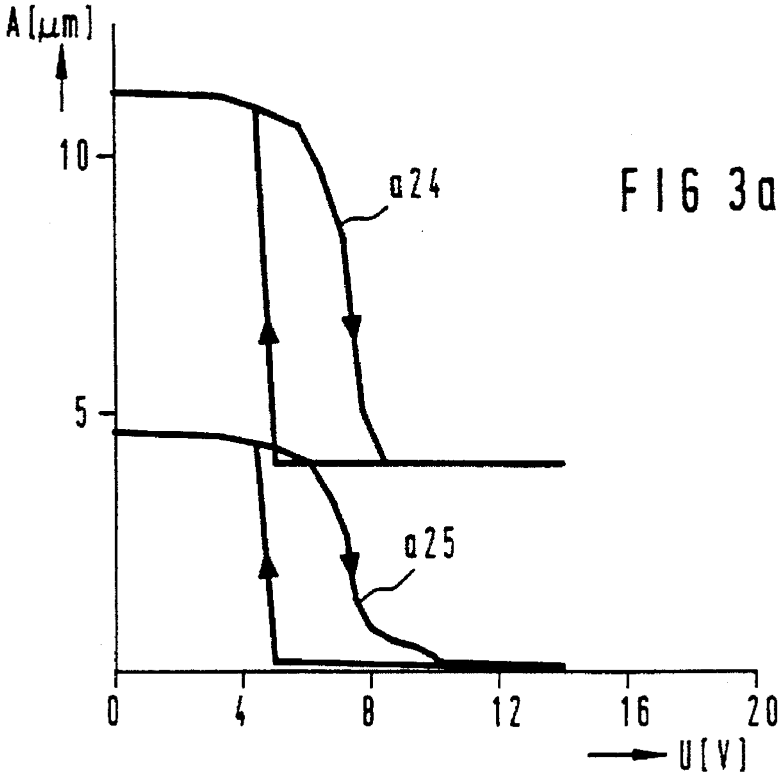
FIGS. 3*a* and 3*b* are diagrams with illustrations of the path of the spacing of the spring tongue from the base electrode and the contacting force, respectively dependent on the control voltage at the electrodes, given a continuous, wedge-shaped air gap between the electrodes of FIG. 1.
Figure 3B:
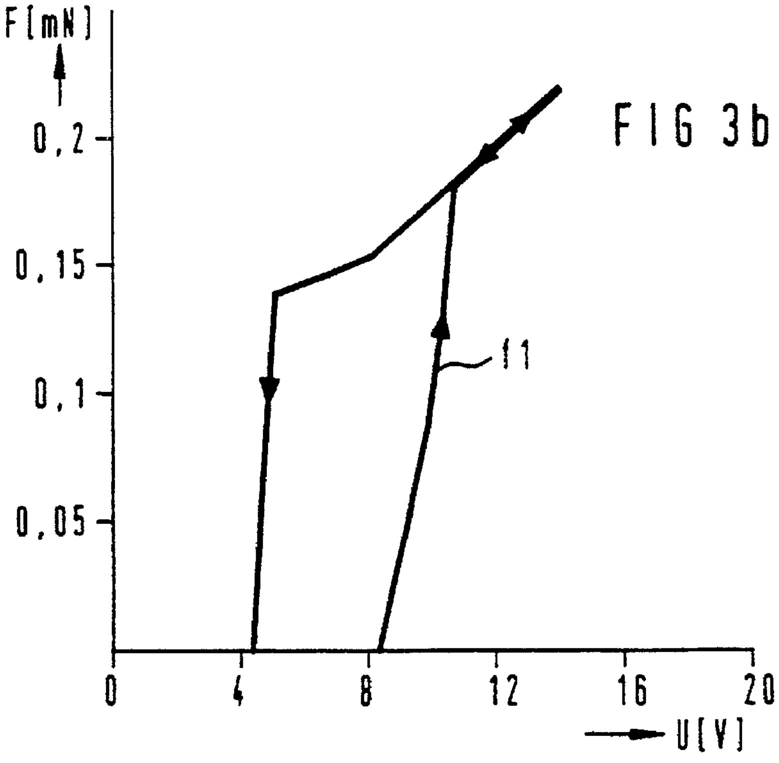

FIG. 3 shows the switch characteristics of a format according to FIG. 1 with a steadily curved spring tongue dependent on the control voltage. FIG. 3*a* shows the spacing A of the spring tongue from the base electrode. The curve a24 shows the path of the spacing of the contact spring region (at the point 24) from the base electrode, whereas the curve a25 shows the corresponding spacing path of the sprint tongue in the fork point 25 between the contact spring region and armature electrode region (end of the slots 8). It may clearly be seen from FIG. 3*a* that the spring tongue steadily approaches the base substrate or the base electrode until the contact is closed at about 8.5 V; the contact spring region of the spring tongue is then at a distance from the base electrode that equals the height of the contact pieces (about 4 µm). The curve of the contacting force F in FIG. 3*b* shows an extremely low contacting force of about 8 µN (curve f1) at the response voltage of 8.5 V., this contacting force continuing to increase with increasing voltage. Only at about 10.5 V does the steeply rising curve change into a characteristic with less steepness. This characteristics curve is not desirable for relays.

Figure 4A:
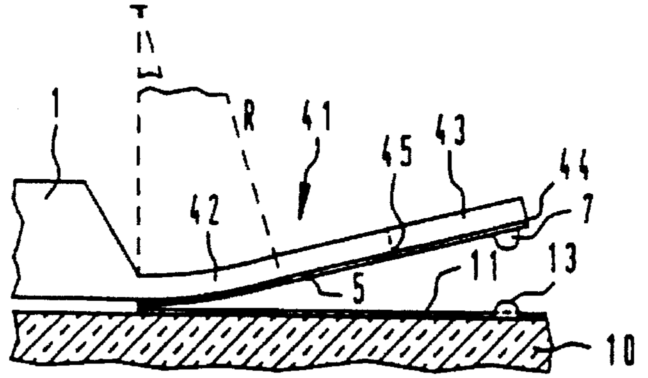
FIGS. 4*a* and 4*b* are schematic illustrations of an only partially curved armature spring tongue in the quiescent and working condition.
Figure 4B:
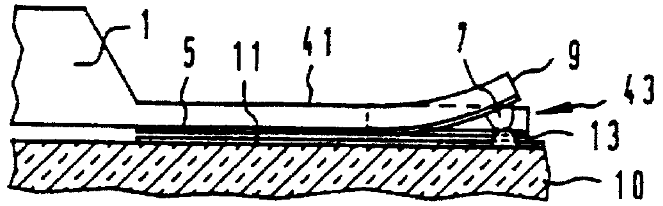

In order to avoid this undesirable creeping contact behavior, various techniques for producing a geometrical discontinuity with which an abrupt switching behavior is produced are proposed according to the invention. FIG. 4 schematically shows a spring tongue 41 that, following its point of attachment, first has a steadily curved section 42 with a radius and, following thereupon, has a straight section 43 up to its free end. Otherwise, the structure is comparable to that of FIG. 1. The armature electrode 5 and the base electrode 11 each respectively extends over the full length of the spring tongue. FIG. 4*b* shows the spring tongue 41 in the attracted condition, whereby the contact pieces lie on one another and the contacting force is generated by the camber or bow of the partially cut-free contact spring region 9 (A small space between the base substrate and the armature substrate is respectively shown in FIGS. 4,6 and 8; in reality, this is limited to only the thickness of an insulating layer)

Figure 5A:
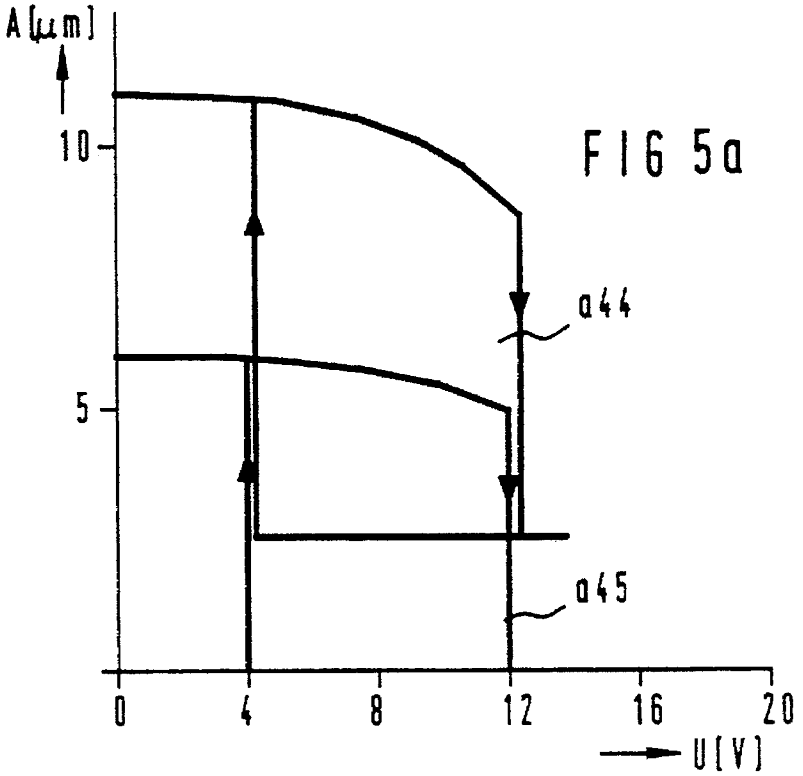
FIGS. 5*a* and 5*b* are diagrams of the path of the spacing between spring tongue and base electrode as well as of the contacting force dependent on the control voltage for the spring tongue of FIG. 4.
Figure 5B:
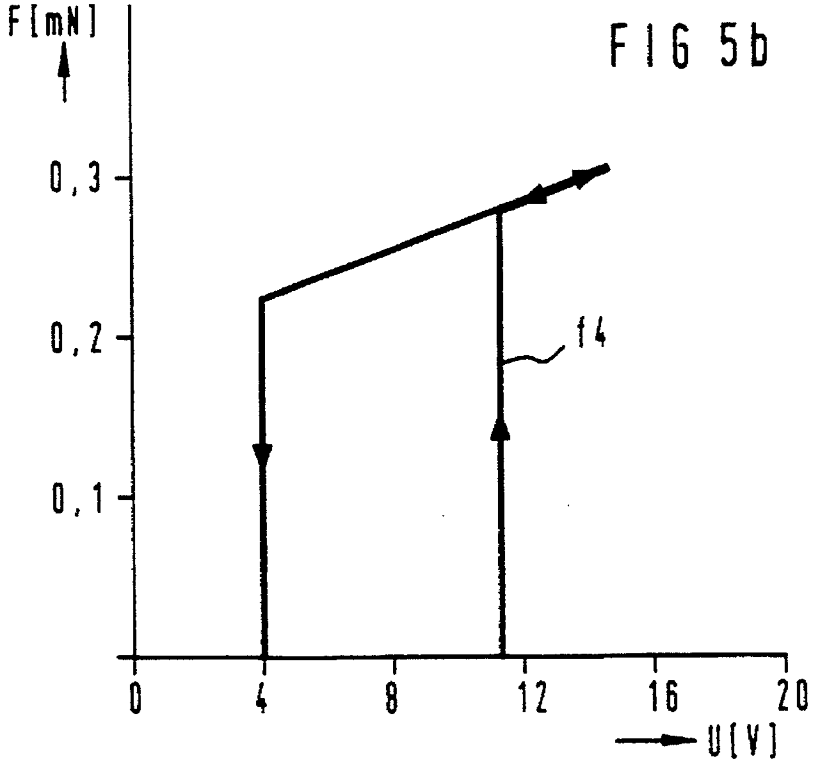

The switch characteristic of an arrangement according to FIG. 4 may be seen in FIGS. 5*a* and 5*b*. The movement of the point 44 at the end of the contact spring region 9 (curve a44) and the movement of the fork point at the attachment of the spring contact region (curve a45) are shown dependent on the control voltage. FIG. 5*b* also shows the curve of the contacting force F dependent on the control voltage (curve f4). A switch characteristic with hysteresis and unambiguous trip events both when closing as well as when opening the contact may be seen. Up to the response voltage of about 12 V, the spring moves by about 10 to 20% of the initial excursion in a quadratic dependency on the voltage, and suddenly connects after exceeding the response voltage. The release occurs at approximately 4 V. According to FIG. 5*b*, a contacting force of about 0.28 mN is achieved at the response voltage of 12 V. The force increase thereafter with reduced slope. As a rough dimensioning, the length of the curved zone 42 should amount to about 20 to 40% of the overall spring length of the spring tongue 41.

Figure 6A:
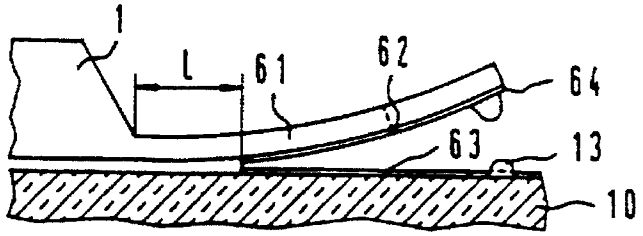
FIGS. 6*a* and 6*b* are the schematic illustrations of a spring tongue with an offset electrode beginning in the quiescent condition and in the working condition.
Figure 6B:
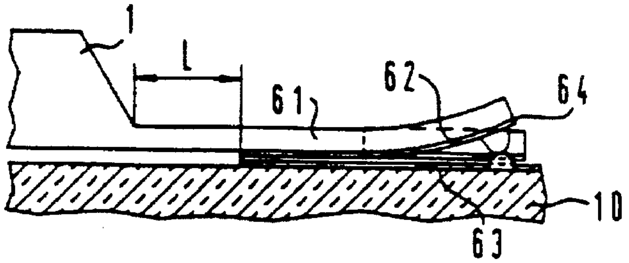

FIG. 6 shows an embodiment of a spring tongue 61 wherein the geometric discontinuity is composed of an offset of the electrodes. In this case, the armature electrode 62 does not begin at the clamping location or attachment point of the spring tongue at the armature substrate 1, as in the previously shown armature electrode 5, but has an offset L relative to the attachment point. Correspondingly, the beginning of the base electrode 63 can also be offset by the amount L without this being critical. FIG. 6*a* shows the quiescent condition of the arrangement, i.e. without control voltage, whereas FIG. 6*b* shows the attracted condition, i.e. with the control voltage present between the electrodes 62 and 63.

Figure 7A:
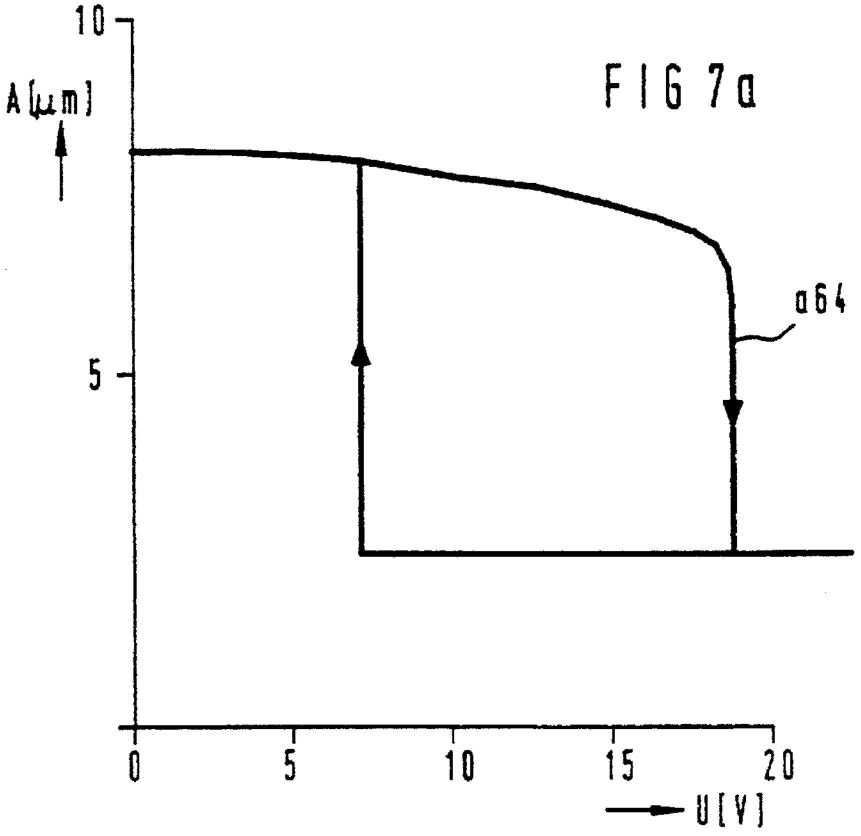
FIGS. 7*a* and 7*b* show the path of the contact spacing and of the contacting force dependent on the control voltage given a spring tongue according to FIG. 6.
Figure 7B:
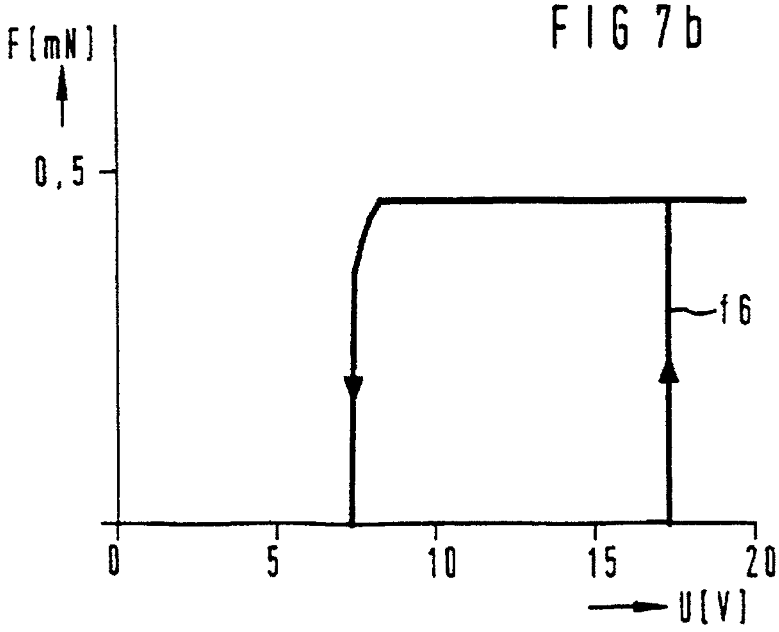

FIG. 7 shows the motion sequence, at the contact point 64 at the end of the spring tongue 61 (curve a64) and, in FIG. 7*b*, the curve of the contacting force (curve f6). The active electrode area is reduced due to the offset electrode of FIG. 6, so that the response voltage is increased compared to FIG. 3. It lies at about 18 V in the example of the simulation. As may be seen from FIGS. 7*a* and 7*b*, unambiguous trip conditions are also achieved, given the design of FIG. 6. The offset length L should be selected approximately in the range of 20 to 40% of the length of the spring tongue.

Figure 8A:
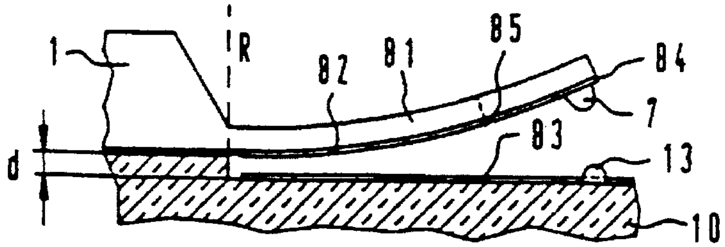
FIGS. 8*a* and 8*b* schematic illustrations of a spring tongue with an additional air gap between the armature electrode and the base electrode in the quiescent condition and in the working condition.
Figure 8B:
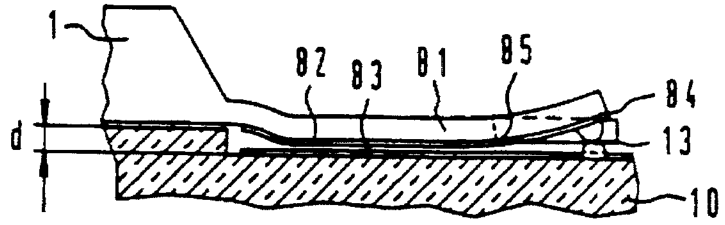

FIG. 8 shows another embodiment of a spring tongue with discontinuity. In this case, a spring tongue 81 having a continuous curvature over its entire length and having an armature electrode 82 proceeding over its entire length is provided. Here, the geometric discontinuity is comprised therein that the base electrode 83 is displaced downward in the base substrate by a distanced, so that a gap having the thickness d arises relative to the clamping location of the spring tongue 81. As may be seen from the curves in FIGS. 9*a* and 9*b*, an increase in the response voltage with unambiguous trip conditions for opening and closing of the contact also results given an arrangement of FIG. 8. Typical switching curves given an air gap width of d=2 μm are shown. The response voltage amounts to 14 V here, whereby all geometric data are comparable, compared to the preceding exemplary embodiments. A gap width of d=1 to 2 μm is available for dimensioning, this being about 10 to 20% of the excursion of the spring end in the quiescent condition.

Figure 9A:
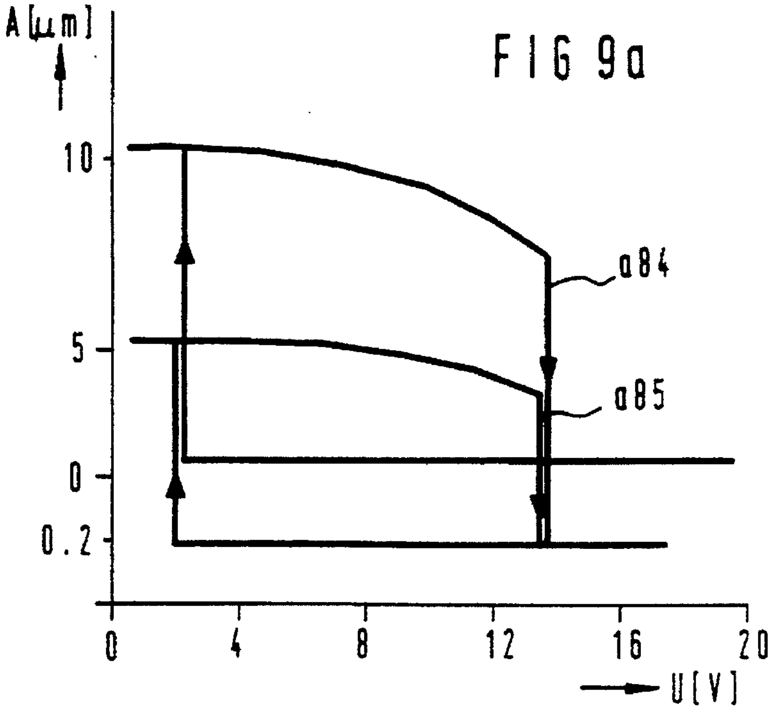
FIGS. 9*a* and 9*b* are diagrams of the path of the spacing between the contact pieces or between the spring tongue and the base electrode as well as the curve of the contacting force dependent on the control voltage given a spring tongue according to FIG. 8.
Figure 9B:
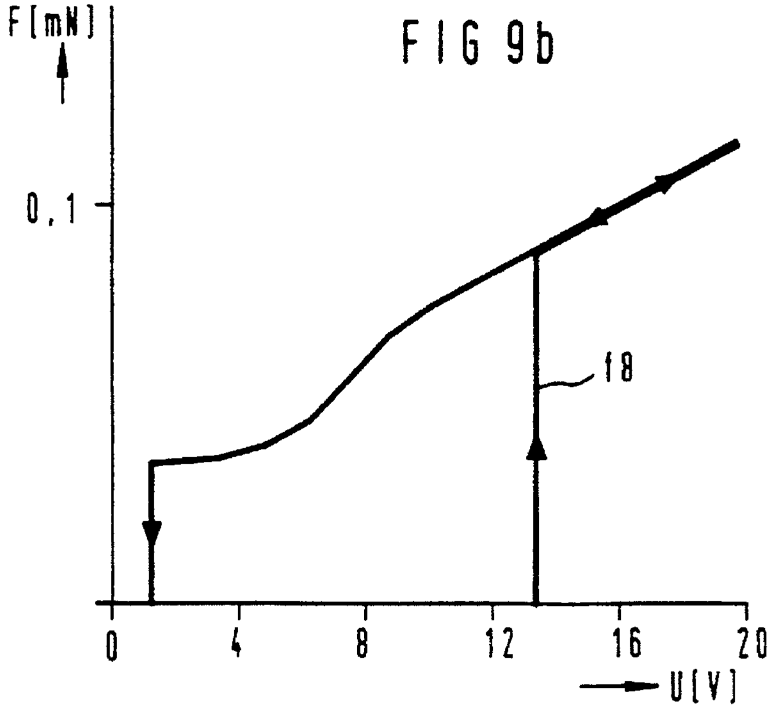

FIG. 9*a* shows the motion sequence at the contact point 84 (curve a84) and at the fork point (curve a85), similar to the illustration in FIG. 5. FIG. 9*b* also shows the curve of the contacting force (curve f8).

As may be seen from the curves in FIGS. 7 and 9, the solutions of FIGS. 6 and 8 lead to increased response voltages, since the overall electrostatic field is reduced. From this point of view, the solution of FIG. 4 with the curves of FIG. 5 offers the optimum exploitation of the electrostatic fields. This solution having an only partially curved spring, however, is more difficult to manufacture than the uniformly curved springs of FIGS. 6 and 8. Which solution is to be ultimately preferred is thus dependent on, among other things, the manufacturing methods and materials that are available. As was already mentioned at the outset, of course, combinations of the various embodiments according to FIGS. 4,6 and 8 could come into consideration and potentially lead to an optimum solution.

Although various minor changes and modifications might be proposed by those skilled in the art, it will be understood that our wish is to include within the claims of the patent warranted hereon all such changes and modifications as reasonably come within our contribution to the art.

We claim as our invention:

1. A micromechanical electrostatic relay, comprising:

a base substrate having a base electrode layer and a base contact piece thereon;

an armature substrate overlying the: base substrate and having an armature spring tongue worked free from and integrally attached at one end to the armature substrate and which is free to move at its opposite free end, said armature spring tongue having an armature electrode layer thereon and also an armature contact piece at said free end;

said armature spring tongue being bent away from the base substrate by a steady curvature in a quiescent condition so that a wedge-shaped air gap is formed between the base electrode layer and the armature electrode layer, and wherein the spring tongue conforms to the base substrate and the base contact piece and armature contact piece lie against one another in a working condition when a voltage is present between the base electrode layer and the armature electrode layer; and said wedge-shaped air gap between the electrodes having at least one geometric discontinuity.

2. A relay according to claim 1 wherein said geometric discontinuity is formed by the spring tongue having a steadily curved section beginning at said one end at a region of attachment to the armature substrate and straight section following thereupon toward said opposite free end.

3. A relay according to claim 2 wherein a length of said curved section is 20 to 40% of an overall length of the spring tongue.

4. A relay according to claim 1 wherein said geometric discontinuity in said wedge-shaped air gap comprises a beginning of an electrode surface of said armature electrode layer being offset in a direction toward said free end relative to an attachment point of said spring tongue to said armature substrate at said one end of said spring tongue.

5. A relay according to claim 4 wherein a length of said offset is between 20 to 40% of an overall length of said spring tongue.

6. A relay according to claim 1 wherein said geometric discontinuity in said wedge-shaped air gap comprises said base electrode layer being spaced downwardly by a predetermined gap from said armature electrode layer at an attachment point of the spring tongue at said first end thereof to said armature substrate, a height of said gap being at least 10% of a total excursion distance of said free end relative to said base substrate in said quiescent condition.

7. A relay according to claim 6 wherein said height of said gap is between 10 and 20% of a total excursion of said free end relative to said base substrate in said quiescent condition.

8. A relay according to claim 1 wherein said spring tongue has a contact spring section at its free end which is partially cut, free by slots, said armature contact piece being arranged on said contact spring section, and a spacing between the base contact piece and the armature contact piece being less than a spacing between the armature electrode layer and the base electrode layer in a region of said free end of said spring tongue.

9. A relay according to claim 8 wherein said contact spring section is in a middle of a width of said spring tongue and is formed by two slots proceeding from said free end of said spring tongue and parallel to lateral edges, a length of said slots being between 20% to 50% of an overall length of said spring tongue.

10. A micromechanical electrostatic relay, comprising:

a base substrate having a base electrode layer and a base contact piece thereon;

an armature substrate overlying the base substrate and having an armature spring tongue worked free from and integrally attached at one end to the armature substrate and which is free to move at its opposite free end, said armature spring tongue having an armature electrode layer thereon and also an armature contact piece at said free end;

said armature spring tongue being bent away from the base substrate by a steady curvature in a quiescent condition so that a wedge-shaped air gap is formed between the base electrode layer and the armature electrode layer, and wherein the spring tongue conforms to the base substrate and the base contact piece and armature contact piece lie against one another in a working condition when a voltage is present between the base electrode layer and the armature electrode layer;

said wedge-shaped air gap between the electrodes having at least one geometric discontinuity; and at said free end, said armature spring tongue having a contact spring section having said armature contact piece thereon and being partially cut free from said free end of said spring tongue by two slots extending from said free end toward said one end, and wherein said armature electrode is split in two pieces and a metallic lead runs between the two pieces of the armature electrode to said armature contact piece.

* * * * *